(12) United States Patent
Chiang et al.

(10) Patent No.: US 12,448,271 B2
(45) Date of Patent: Oct. 21, 2025

(54) LIQUID SUPPLY SYSTEM AND LIQUID PREPARATION METHOD

(71) Applicant: TAIWAN SEMICONDUCTOR MANUFACTURING COMPANY LTD., Hsinchu (TW)

(72) Inventors: Fang-Pin Chiang, Taichung (TW); Chi-Tung Lai, Hsinchu (TW); Heng-Yi Tseng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/495,793

(22) Filed: Oct. 27, 2023

(65) Prior Publication Data
US 2024/0059549 A1    Feb. 22, 2024

Related U.S. Application Data

(62) Division of application No. 17/214,086, filed on Mar. 26, 2021, now Pat. No. 11,834,322.

(51) Int. Cl.
*B67D 7/16* (2010.01)
*B67D 7/14* (2010.01)
*G01F 23/68* (2006.01)
*H01L 21/67* (2006.01)

(52) U.S. Cl.
CPC ............... *B67D 7/16* (2013.01); *B67D 7/145* (2013.01); *H01L 21/67017* (2013.01)

(58) Field of Classification Search
CPC .......... B67D 7/16; B67D 7/145; G01F 23/686
USPC ......................................................... 137/428
See application file for complete search history.

(56) References Cited

U.S. PATENT DOCUMENTS

| | | | |
|---|---|---|---|
| 6,732,388 B2 * | 5/2004 | McKenna | G01F 23/74 4/669 |
| 2001/0003067 A1 * | 6/2001 | Kamikawa | H01L 21/67051 438/758 |
| 2019/0381472 A1 * | 12/2019 | Gaffey | C01B 11/023 |

FOREIGN PATENT DOCUMENTS

| | | |
|---|---|---|
| CN | 202145144 U | 2/2012 |
| GB | 2100021 A | 12/1982 |

* cited by examiner

*Primary Examiner* — Paul J Gray
(74) *Attorney, Agent, or Firm* — WPAT LAW; Anthony King (57) ABSTRACT

A liquid preparation method is provided. The method includes measuring, with a detection member, a quantity of a liquid stored in a liquid tank by emitting a detection signal toward a floating member positioned in a tube. The tube extends in a height direction of the liquid tank and fluidly connects to two connecting ports of the liquid tank that are located at opposite sides of a surface of the liquid, and the position of the floating member in the tube varies according to a level of the liquid in the liquid tank. The method also includes regulating the liquid in the liquid tank in response to the quantity of the liquid in the liquid tank.

20 Claims, 10 Drawing Sheets

LIQUID SUPPLY SYSTEM AND LIQUID PREPARATION METHOD

PRIORITY CLAIM AND CROSS-REFERENCE

This application is a divisional and claims the benefit of U.S. non-provisional application Ser. No. 17/214,086 filed on Mar. 26, 2021, the disclosures of which are hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Integrated circuits are typically manufactured on a single semiconductor wafer. The individual dies are singulated by sawing the integrated circuits along a scribe line. The individual dies are then packaged separately, in multi-chip modules, or in other types of packaging, for example.

During the manufacturing of the semiconductor devices, various processing steps are used to fabricate integrated circuits on a semiconductor wafer. For example, semiconductor devices are formed on a semiconductor substrate using several wet chemical processing operations. The wet processing operations may include cleaning operations, stripping operations and etching operations in which liquid chemical is supplied to the wafer for performing these wet processing operations.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

As used herein, "fluid" means a flowable material in the liquid phase, or in a combination of the liquid phase and the solid phase. Examples of flowable material in the liquid phase include, but are not limited to, deionized water (DI), deionized water mixed with $CO_2$ (hereinafter "$CO_2$-DI water") and various wafer processing chemicals. Examples of wafer processing chemical (hereinafter "chemicals") include, but are not limited to, $H_2SO_4$, $H_2O_2$, $NH_4OH$, thinners, developers, solvents etc. Examples of flowable material in a combination of the liquid phase and the solid phase include, but are not limited to, slurries for chemical-mechanical planarization and/or chemical-mechanical polishing. Such slurries include a liquid and solid particles dispersed therein.

As used herein, the terms "line," "piping," and "tubing" are used interchangeably and refer to any type, size, or configuration of flow conduit conventionally used in the art for transporting liquids (including slurries) and/or gaseous materials and combinations thereof.

Figure 1:
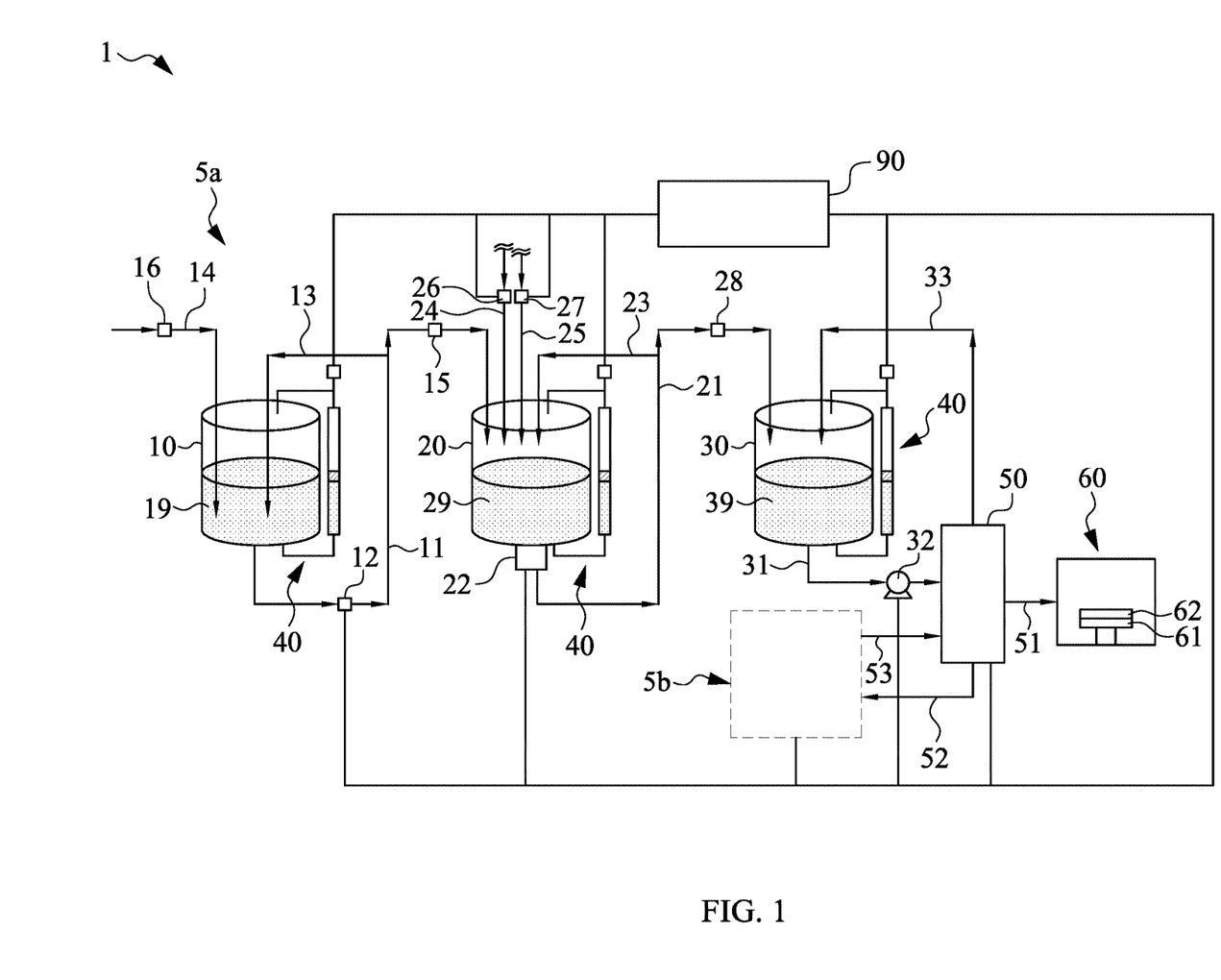
FIG. 1 is a schematic view of a liquid supply system, in accordance with some embodiments of the present disclosure.

FIG. 1 is a schematic view of a liquid supply system 1, in accordance with some embodiments of the present disclosure. In some embodiments, the liquid supply system 1 includes a first liquid supply module 5a and a second liquid supply module 5b, a valve manifold box 50 (VMB), a processing tool 60, and a controller 90. It is appreciated that the features described below can be replaced or eliminated in other embodiments of the liquid supply system 1.

In some embodiments, the first liquid supply module 5a includes a number of liquid tanks, such as liquid tanks 10, 20 and 30 for containing liquid chemicals. In some embodiments, the liquid tanks 10, 20 and 30 are sequentially connected via suitable piping and valving arrangements such that the liquid from the liquid tank 10 can be delivered to the processing tool 60 via the liquid tank 20, the liquid tank 30, and the valve manifold box 50 in sequence. The liquid tanks 10, 20 and 30 are made of a material compatible with the fluid stored therein. Examples of material of the liquid tanks 10, 20 and 30 include, but are not limited to, stainless steel and plastic materials, such as polytetrafluoroethylene (PTFE), polyethylene (PE), and polypropylene (PP). A capacity of the liquid tanks 10, 20 and 30 is, for example, from 100 to 30,000 liters. In at least one embodiment, the capacity of the liquid tanks 10, 20 and 30 is about 10,000 to about 30,000 liters.

In some embodiments, the liquid tank 10 is configured to store undiluted concentrated liquid, the liquid tank 20 is configured to mix more than two different liquid chemicals, and the liquid tank 30 is configured to store at least the daily quantity of liquid chemical used by the processing tool 60. For purposes of illustration, in the following description, the liquid tank 10 is referred to as source tank 10, the liquid tank 20 is referred to as mixing tank 20, and the liquid tank 30 is referred to as day tank 30.

In some embodiments, the first liquid supply module 5a further includes a discharging piping 11, a liquid transfer pump 12, a recirculation piping 13, an inlet piping 14, and a valve 15. The discharging piping 11 fluidly connects the source tank 10 to the mixing tank 20. The liquid transfer pump 12 is configured to take suction from the source tank 10 to the mixing tank 20 via the discharging piping 11 for preparing a dilute mixture. The recirculation piping 13 is configured for recirculating the liquid 19 back to the source tank 10. The inlet piping 14 is configured to refill the liquid 19 when the liquid level in the source tank 10 is lower than a threshold value. The valve 15 is connected to the discharging piping 11 and is configured to regulate the delivery of the liquid 19 from the source tank 10 to the mixing tank 20. In some embodiments, the source tank 10 is a replaceable drum. When the liquid 19 in the source tank 10 is emptied, the empty drum is replaced with a new one with full liquid stored therein, and the inlet piping 14 is omitted accordingly.

In some embodiments, the first liquid supply module 5a also includes a discharging piping 21, a mixer 22, a recirculation piping 23, a number of inlet piping 24 and 25, and valves 26 and 27. The mixer 22 is coupled to the bottom of the mixing tank 20. The mixer 22 may be a bearing-less magnetically levitated impeller type fluid pump mixer. The mixer 22 may combine the functions of agitating/mixing the contents of mixing tank 20 and transporting the dilute fluid to day tank 30. The discharging piping 21 fluidly connects the mixer 22 to the day tank 30. The recirculation piping 23 fluidly connects the discharging piping 21 to the mixing tank 20. The liquid 29 of mixing tank 20 is recirculated back through the mixing tank 20 through the recirculation piping 23 using the mixer 22. The valve 28 is connected to the discharging piping 21 and is configured to regulate the delivery of the liquid 29 from the mixing tank 20 to the day tank 30.

The inlet piping 24 and 25 fluidly connect different sources (not shown in figures) to the mixing tank 20. For example, the discharging piping 24 is connected to a source of deionized water (DI) and the discharging piping 25 is connected to a source of chemical or chemicals such as $H_2O_2$. The mixing tank 20 combines the undiluted fluid 19 from the source tank 10 with deionized water and $H_2O_2$ in some embodiments to form a dilute fluid mixture suitable for use in the processing performed in the processing tool 60. Valves 26 and 27 may be connected to the inlet piping 24 and 25 for controlling the delivery of the liquid into the mixing tank 20 via the inlet piping 24 and 25.

In some embodiments, the first liquid supply module 5a also includes a discharging piping 31, a liquid transfer pump 32 and a fluid return piping 33. The discharging piping 31 is connected to a bottom of the day tank 30. The liquid transfer pump 32 takes suction from the day tank 30 via the discharging piping 31. The liquid transfer pump 32 discharges liquid via the discharging piping 31 to the valve manifold box 50. The liquid return piping 33 is provided for returning some or all of the liquid from the valve manifold box 50 to the day tank 30 depending on whether liquid is being demanded by the processing tool 60.

In some embodiments, the second liquid supply module 5b has the same configuration as that of the first liquid supply module 5a. The second liquid supply module 5b is fluidly connected to the valve manifold box 50 via a discharging piping 53 and a returning piping 52. The second liquid supply module 5b is arranged to provide reliability and operational flexibility in the liquid feed system, so that the second liquid supply module 5b may be omitted in some other embodiments.

In some embodiments, the valve manifold box 50 as shown in FIG. 1 is provided to allow switching the liquid source from either the first liquid supply module 5a or the second liquid supply module 5b to feed liquid to the processing tool 60. The valving and associated piping branches in the valve manifold box 50 are configured and adapted accordingly to operably isolate or allow liquid flow from the first liquid supply module 5a or from the second liquid supply module 5b to the processing tool 60 for processing semiconductor wafers. In some embodiments, the valve manifold box 50 may be operable to provide liquid flow from both first liquid supply module 5a or the second liquid supply module 5b to the processing tool 60 via a discharge piping 51.

In one or more embodiments, the processing tool 60 includes one or more wafer processing equipment configured to perform one or more processes on semiconductor wafers. Examples of processing performed by the processing tool 60 include, but are not limited to, etching, stripping, cleaning, planarization (e.g., chemical-mechanical planarization) and polishing (e.g., chemical-mechanical polishing). In some embodiments, the processing tool 60 includes a wafer stage 61. The wafer stage 61 is configured to support a wafer 62 during processing of the wafer 62 in the processing tool 60. The wafer stage 61 may be any structure that supports, holds, or secures the wafer 62 during processing. The wafer stage 61 is provided as an example of a wafer handling structure. A wafer handling structure may be any structure of a semiconductor manufacturing apparatus or tool which supports, secures, moves, or otherwise handles a wafer during processing of the wafer. The wafer 62 may be a semiconductor wafer, which in some embodiments may include electrical features on a front side (e.g., the upper side as illustrated in FIG. 1) of the wafer 62. In some embodiments, the wafer 62 may be a monocrystalline silicon (Si) wafer, an amorphous Si wafer, a gallium arsenide (GaAs) wafer, or any other semiconductor wafer.

The quantity of fluid in the source tank 10, the mixing tank 20 and the day tank 30 may each be measured using liquid measurement modules 40 as described hereinafter.

Figure 2:
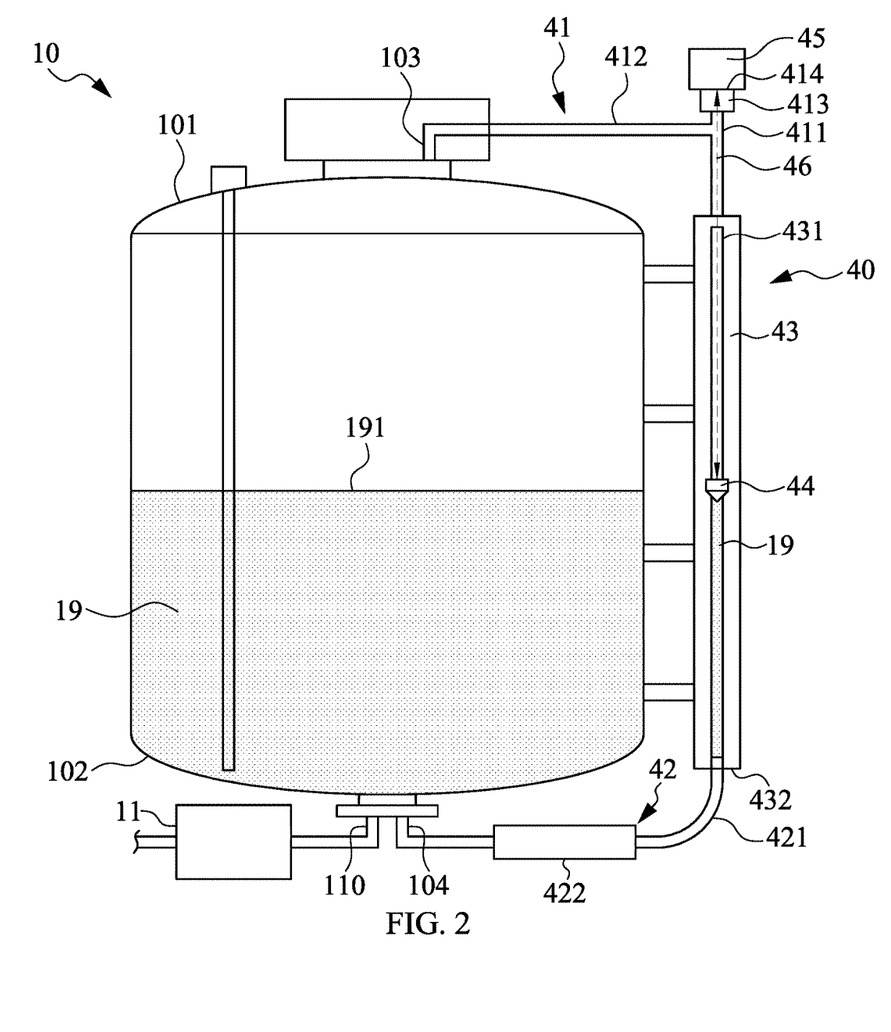
FIG. 2 is a schematic view of a liquid tank with a liquid measurement module, in accordance with some embodiments of the present disclosure.

FIG. 2 is a schematic view of the source tank 10 with the liquid measurement module 40, in accordance with some embodiments of the present disclosure. In some embodiments, the source tank 10 has an upper surface 101 and a lower surface 102 located at two opposite ends of the liquid tank 10 in a height direction of the liquid tank 10. A connecting port 103 is formed at the upper surface 101, and a connecting port 104 is formed at the lower surface 102. When a liquid 19 is stored in the source tank 10, the connecting ports 103 and 104 are located at two opposite sides of a surface 191 of the liquid. As a result, the connecting port 103 communicates with an upper portion of the interior of the source tank 10 which is filled with gaseous material, and the connecting port 104 communicates with a lower portion of the interior of the source tank 10 which is filled with gaseous material at which liquid material is filled with.

In some embodiments, the liquid measurement module 40 includes an upper connecting line 41, a lower connecting line 42, a tube 43, a floating member 44 and a detection member 45. The tube 43 is positioned adjacent to the source tank 10 and located outside the interior of the source tank 10 which is used to store liquid 19. In some embodiments, the tube 43 is a hollow structure and extends along a height direction of the source tank 10. In some embodiments, a height of the tube 43 is slightly smaller than a height of the source tank 10. For example, an upper end 431 is located lower than the highest point of the upper surface 101 of the source tank 10, and a lower end 432 of the tube 43 is located higher than the lowest point of the source tank 10.

The upper connecting line 41 is connected between the connecting port 103 and the upper end 431 of the tube 43. The lower connecting line 42 is connected between the connecting port 104 and the lower end 432 of the tube 43. In some embodiments, the upper connecting line 41 has a right-angle portion. Specifically, as shown in FIG. 2 the upper connecting line 41 has a first segment 411 and a second segment 412. The first segment 411 is connected to the upper end 431 of the tube 43 and extends in a longitudinal direction of the tube 43. The second segment 412 is connected to the first segment 411 and extends in a horizontal direction that is perpendicular to the longitudinal direction of the tube 43. An intersection point of the first segment 411 and the second segment 412 is distant away from an end of the first segment 411 that is away from the tube 43. As a result, the upper connecting line 41 constitutes a T-shaped structure. The lower connecting line 42 has a curved portion and includes a first segment 421 and a second segment 422. The first segment 421 of the lower connecting line 42 is connected to the lower end 432 of the tube 43 and extends along a curved path. The second segment 422 of the lower connecting line 42 connects the first segment 421 to the connecting port 104 and extends in a horizontal direction.

In some embodiments, the upper connecting line 41 further includes a cap portion 413 (transparent window) connected to the end of the first segment 411 that is away from the tube 43. The cap portion 413 has a wider width than the first segment 411. In some embodiments, the first segment 411, the second segment 412 and the cap portion 413 of the upper connecting line 41 are integrally formed with the same material. In some embodiments, at least the cap portion 413 of the upper connecting line 41 is made of material which serves as a transparent window and allows a transmission of a detection signal generated by the detection member 45 to pass through. In one exemplary embodiment of the present disclosure, the cap portion 413 of the upper connecting line 41 is constructed of a transparent material such Teflon™ PFA (perfluoroalkoxy alkane) or the like.

As shown in FIG. 2, when the liquid 19 is stored in the source tank 10, a portion of the liquid 19 flows into the tube 43 via the lower connecting line 42. According to the concept of the communicating vessel, when the liquid 19 settles, it balances out to the same level in both the source tank 10 and the tube 43 regardless of the shape and volume of the source tank 10 and the tube 43. In addition, if additional liquid is added to the source tank 10, the liquid will again find a new equal level in both the source tank 10 and the tube 43.

In some embodiments, an outlet port 110 is formed at the lower surface 102 of the source tank 10. The outlet port 110 is configured for the connection of the discharging piping 11. In some embodiments, the connection port 104 which is formed at the lower surface 102 of the source tank 10 is located immediately adjacent to the outlet port 110 of the source tank 10 that is connected to the discharging piping 11. Since the fluid 19 in the source tank 10 near the outlet port 110 is periodically or continuously actuated to flow for the supply of the fluid 19 to the discharging piping 11, there advantageously is no "dead" flow at the bottom of the source tank 10, which mitigates a concern that the fluid may accumulate and clump or harden at the lower connecting line 42 of the liquid measurement module 40. Therefore, an accuracy of the level measurement of the liquid 19 can be improved. In some embodiments, both the lower connecting line 42 and the discharging line 21 are connected to the same outlet port.

Figure 3:
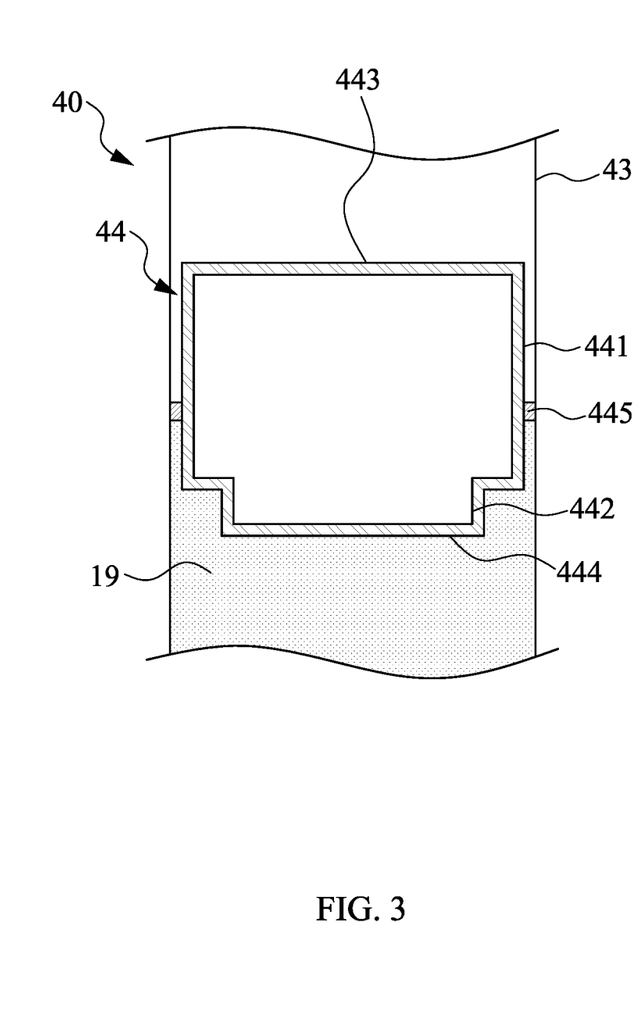
FIG. 3 is a cross-sectional view of a floating member in a tube of a liquid measurement module, in accordance with some embodiments of the present disclosure.

FIG. 3 is a cross-sectional view of the floating member 44 in the tube 43 of the liquid measurement module 40, in accordance with some embodiments of the present disclosure. The floating member 44 is positioned in the tube 43 and is floated on the surface of the liquid 19 in the tube 43. Therefore, the floating member 44 is movable in different positions in the tube 43 in response to the change in the level of the liquid in the tube 43. In some embodiments, the floating member 44 is a hollow structure with sloped, tapered, or stepped sidewalls. For example, as shown in FIG. 3 the floating member 44 includes a first portion 441 and a second portion 442. The first portion 441 is connected to a top surface 443 of the floating member 44, and the second portion 442 is connected to a bottom surface 444 of the floating member 44. A width of the first portion 441 is greater than a width of the second portion 442. As a result, the floating member 44 has stepped sidewalls.

In some embodiments, a sealing portion 445 is formed at the outer side wall of the first portion 441. The sealing portion 445 surrounds the first portion 441 in a circumferential direction of the floating member 44. The outer diameter of the sealing portion 445 can be equal to or slightly smaller than a diameter of the tube 43. With the sealing portion 445, the floating member 44 can stay in the tube 43 horizontally and exactly and accurately move according to the level of the liquid 19 in the tube 43. However, it should be appreciated that many variations and modifications can be made to embodiments of the disclosure. In some other embodiments, the sealing portion 445 is omitted, and the first portion 441 has a width that is equal to or slightly smaller than a diameter of the tube 43.

In some embodiments, due to the extreme corrosive nature of the processing liquids that are normally used in the wet chemical processing of semiconductor wafers, the floating member 44 is constructed of a corrosion resistant material such as Teflon™ PTFE (polytetrafluoroethylene) or the like. In addition, in order to reflect the detection signal emitted from the detection member 45, at least the top surface 443 of the floating member 44 is made of or coated with material that is opaque to the detection signal generated by the detection member 45. For example, a coating of metallic material can be formed on the top surface 443. In some embodiments, the top surface 443 includes a flat surface to reflect vertically the detection signal of the detection member 45.

Figure 4:
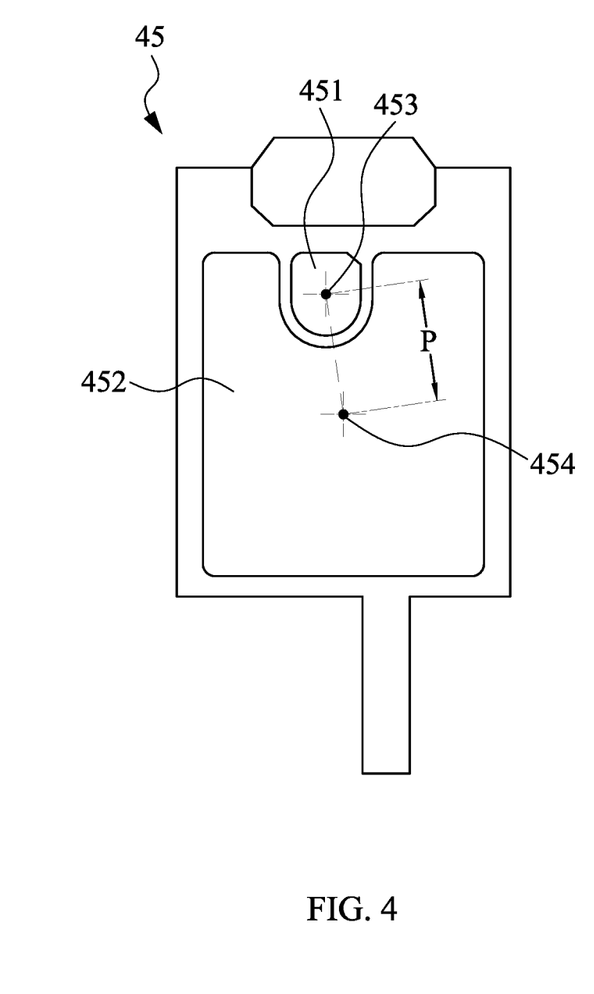
FIG. 4 is a schematic view of a detection member, in accordance with some embodiments of the present disclosure.

FIG. 4 is a schematic view of the detection member 45, in accordance with some embodiments of the present disclosure. With reference to FIGS. 2 and 4, the detection member 45 is configured to detect a position of the floating member 44 in the tube 43. The monitored position of the floating member 44 is utilized by the controller 90 for determining the quantity of the liquid 19 stored in the source tank 10. In the present embodiment, the laser detection member 45 includes a signal source 451 configured to produce a detection signal (e.g., a laser beam) and a signal receiver 452 configured to monitor the detection signal reflected from the tube 43. In some embodiments, the detection signal 46 (FIG. 2) produced by the signal source 451 includes a laser beam. The laser beam may be in the visible band or invisible bands such as infrared or near infrared. In some embodiments, as shown in FIG. 4, a center 453 of the signal source 451 is distant from a center 454 of the signal receiver 452 by a distance P. In the present exemplary embodiment, the distance P is smaller than a width of a top surface 414 of the cap portion 413 so as to allow the transmission of the detection signal into the upper connecting line 41. A method for operating the detection member 45 will be further explained with reference to FIGS. 5-9.

It will be appreciated that while the liquid measurement module 40 illustrated in the above mentioned embodiments is used in the source tank 10 for measuring the quantity of the liquid in the source tank 10, the liquid measurement module 40 can be implemented in any liquid tank in the liquid supply system 1. For example, as shown in FIG. 1, multiple liquid measurement modules 40 are connected to the mixing tank 20 and the day tank 30 and configured for measuring the quantity of the liquid in the mixing tank 20 and the day tank 30.

Figure 5:
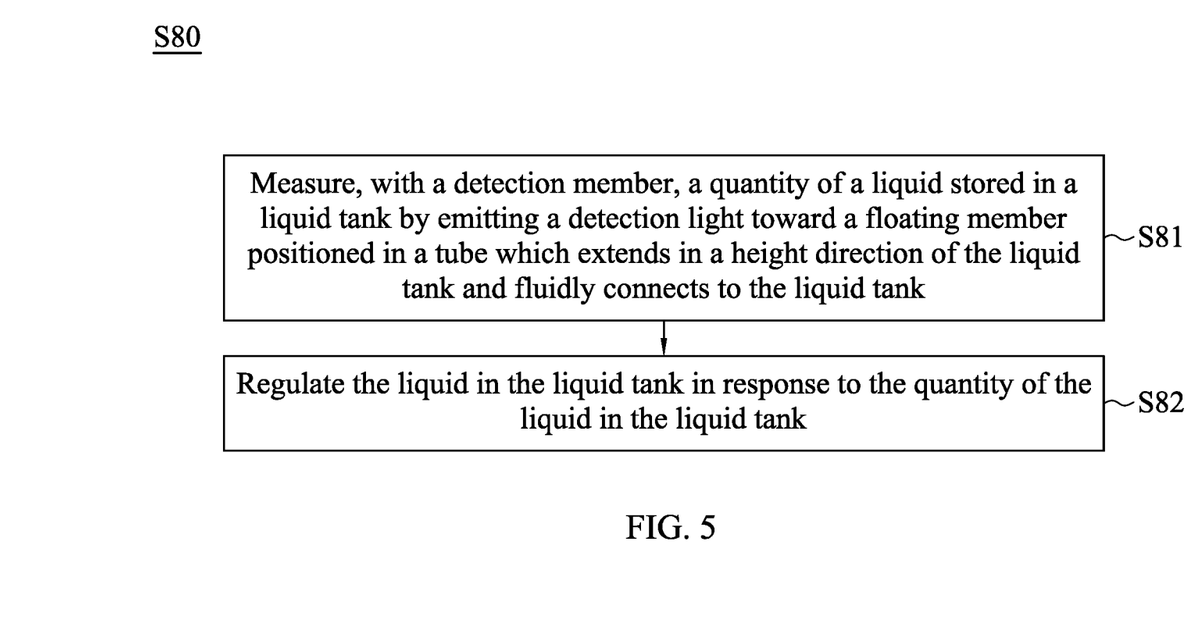
FIG. 5 is a flow chart illustrating stages in a method for the preparation and delivery of liquid in the liquid supply system, in accordance with some embodiments.

FIG. 5 is a flow chart illustrating stages in a method S80 for the preparation and delivery of liquid in the liquid supply system 1, in accordance with some embodiments. For illustration, the flow chart will be described to accompany the schematic view shown in FIGS. 6-8. Some of the described stages can be replaced or eliminated in different embodiments. Additional features can be added to the semiconductor device structure. Some of the features described below can be replaced or eliminated in different embodiments.

Figure 6:
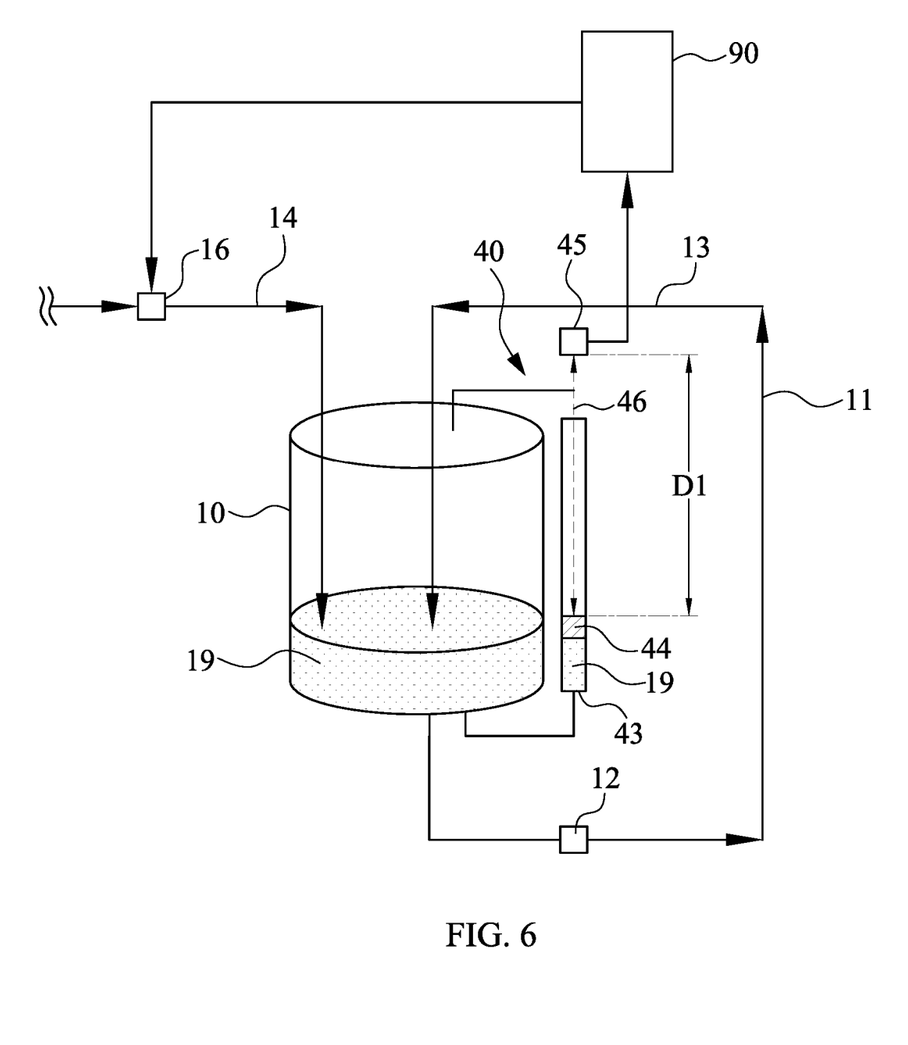
FIG. 6 is a schematic view illustrating an operation of a method for regulating liquid in which a liquid is supplied into a liquid tank in response to a low-level signal produced by a liquid measurement module, in accordance with some embodiments of the present disclosure.

The method S80 includes operation S81, in which a quantity of a liquid stored in a liquid tank is measured. In some embodiments, the measurement of the quantity of a liquid stored in a liquid tank, such as the liquid tanks 10, 20 and 30, is performed by the use of the liquid measurement module 40. For example, as shown in FIG. 6, to measure the quantity of a liquid in the source tank 10, a detection signal 46, such as laser beam, is generated by the detection member 45 and projected toward the floating member 44 in the tube 43. Specifically, as shown in FIG. 2, the detection signal 46 from the signal source 451 (FIG. 4) of the detection member 45 enters the upper connecting line 41 by passing through the top surface 414 of the cap portion 413 and then travels along the first segment 411 of the upper connecting line 41. The detection signal 46 from the first segment 411 of the upper connecting line 41 is then transmitted into the tube 43 by passing through the upper end 431 of the tube 43, and is projected on the top surface 443 (FIG. 3) of the floating member 44. The detection signal 46 reflected by the top surface 443 then passes through the first segment 411 and the cap portion 413 and enters the signal receiver 452 (FIG. 4) of the detection member 45.

To determine the quantity of a liquid in the source tank 10, the signal receiver 452 (FIG. 4) calculates a time interval $\Delta t_1 = t2 - t1$ for the detection signal, where t1 is the time when the signal source 451 transmits the detection signal 46 and t2 is the time when the signal receiver 452 receives the detection signal 46 reflected from the floating member 44. The calculated time interval is then sent to the controller 90, and the controller 90 calculates a distance D1 between the detection member 45 and the floating member 44 according to the equation of $D1 = c*\Delta t_1/2$, where c is speed of light. Once the distance D1 between the detection member 45 and the floating member 44 is determined, the level of the liquid 19 can be calculated by subtracting the total height of the tube 43 with the distance D1. Thereafter, the quantity of the liquid 19 in the source tank 10, which is proportional to the level of the liquid 19, can be determined.

In some embodiments, the measurement of the liquid level is continuously performed. In some other embodiments, the measurement of the liquid level is periodically or irregularly performed. In some embodiments, the measurement of the liquid level is triggered when a specific event occurs. For example, the measurement of the liquid level is initiated when liquid is refilled into the source tank 10 and terminated when the refilling of the liquid is stopped.

The method S80 also includes operation S82, in which the liquid in the liquid tank is regulated in response to the quantity of the liquid in the liquid tank. The quantity of the liquid in the liquid tank can be applied in many processes during the preparation and delivery of the liquid in semiconductor fabrication process. Many possible applications are described below, but it will be noted that the present disclosure is not limited thereto.

In some embodiments, the data in relation to the quantity of the liquid is used to determine whether to refill liquid into the liquid tank. For example, as shown in FIG. 6, after the supply of the liquid 19 from the source tank 10 is performed for a period of time, the level of the liquid 19 in the source tank 10 lowers gradually, which causes an increasing of a distance D1 between the detection member 45 and the floating member 44. When the distance D1 calculated by the controller 90 is greater than a predetermined value, the controller 90 may issue a signal to automatically open or alert operating personnel to manually open valve 16 for filling the source tank 10 with liquid 19. The predetermined value may indicate a low level of the liquid 19 in the source tank 10.

During the filling of the liquid 19 into the source tank 10, the controller 90 may also actuate the liquid transfer pump 12 to perform a circulation process to drive the liquid 19 passing through the discharging piping 21 and the recirculation piping 13 and back to the source tank 10. The process for refilling the liquid may be terminated by closing the valve 16 when the distance D1 calculated by the controller 90 is smaller than a threshold value, which may indicate a high level of the liquid 19 in the source tank 10.

Figure 7:
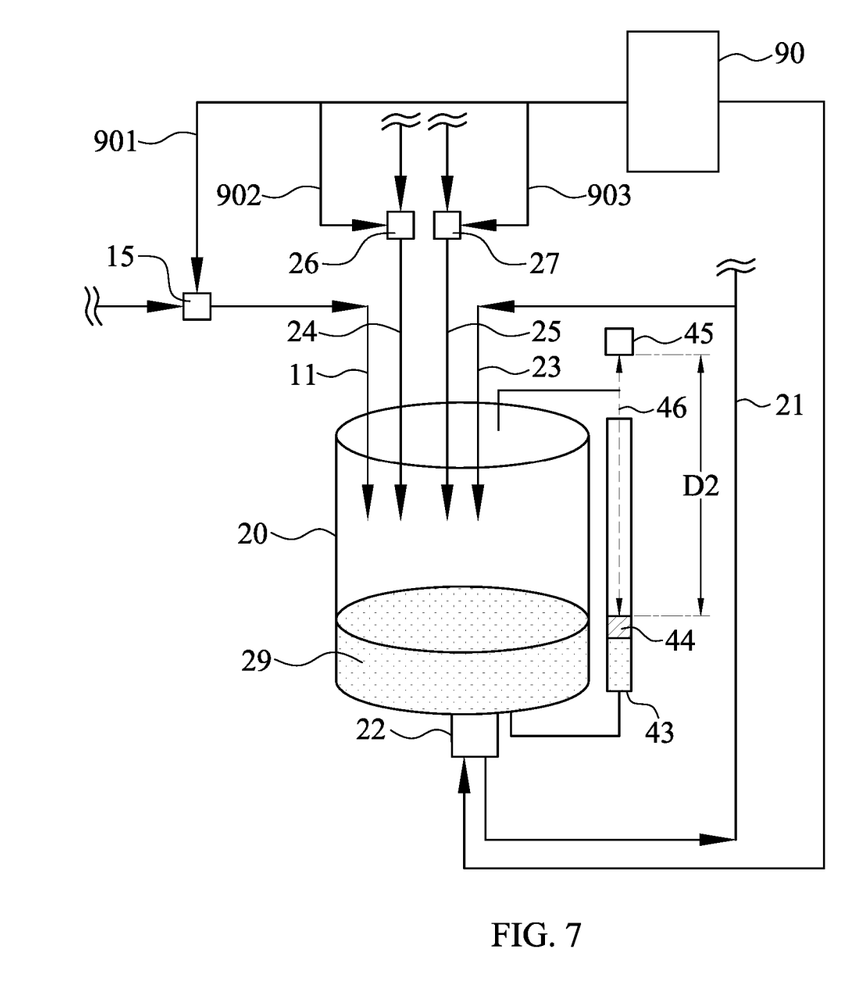
FIG. 7 is a schematic view illustrating an operation of a method for regulating liquid in which various liquids are supplied into a liquid tank for preparing a liquid mixture, in accordance with some embodiments of the present disclosure.

In some embodiments, the data in relation to the quantity of the liquid is used to facilitate a preparation of liquid of mixture. For example, as shown in FIG. 7, while the supply of the liquid 29 from the mixing tank 20 is performed for a period of time, the level of the liquid 29 in the mixing tank 20 lowers gradually, which causes an increasing of a distance D2 between the detection member 45 and the floating member 44. When the distance D2 calculated by the controller 90 is greater than a predetermined value, the controller 90 sends signals for preparing the liquid of mixture, such as dilute liquid. To prepare the dilute liquid 29, the controller 90 outputs signals 901, 902 and 903 to automatically open the valves 15, 26 and 27 to fill the mixing tank 20 with the liquid 19 from the source tank 10 and other liquid, such as deionized water or chemicals, from the inlet piping 24 and 25 for diluting the liquid 19.

In some embodiments, the signals 901, 902 and 903 from the controller 90 are issued one by one, such that the valves 15, 26 and 27 are opened in order to supply different liquids into the mixing tank 20. In some embodiments, a time interval for opening the valves 15, 26 and 27 is determined by the distance D2. Specifically, during the supply of the liquid from the discharging piping 21, the supply of liquid from the inlet piping 24 and the supply of liquid from the inlet piping 25, the detection member 45 continuously detects the distance D2. Since a decreased amount of the distance D2 is proportional to the quantity of liquid added into the mixing tank 20, the controller 90 can determined whether a desired amount of liquid is added into the mixing tank by monitoring the value of the distance D2. As a result, once a change of the distance D2 reaches a desired value, the controller 90 issues a signal to close the corresponding valve and then open another valve for supplying different liquid into the storing tank 20. After all the liquids are added into the mixing tank 20, the controller 90 may issue a signal to the mixer 22 to blend the liquids in the mixing tank 20 so as to complete the preparation of the dilute liquid in the mixing tank 20.

Figure 8:
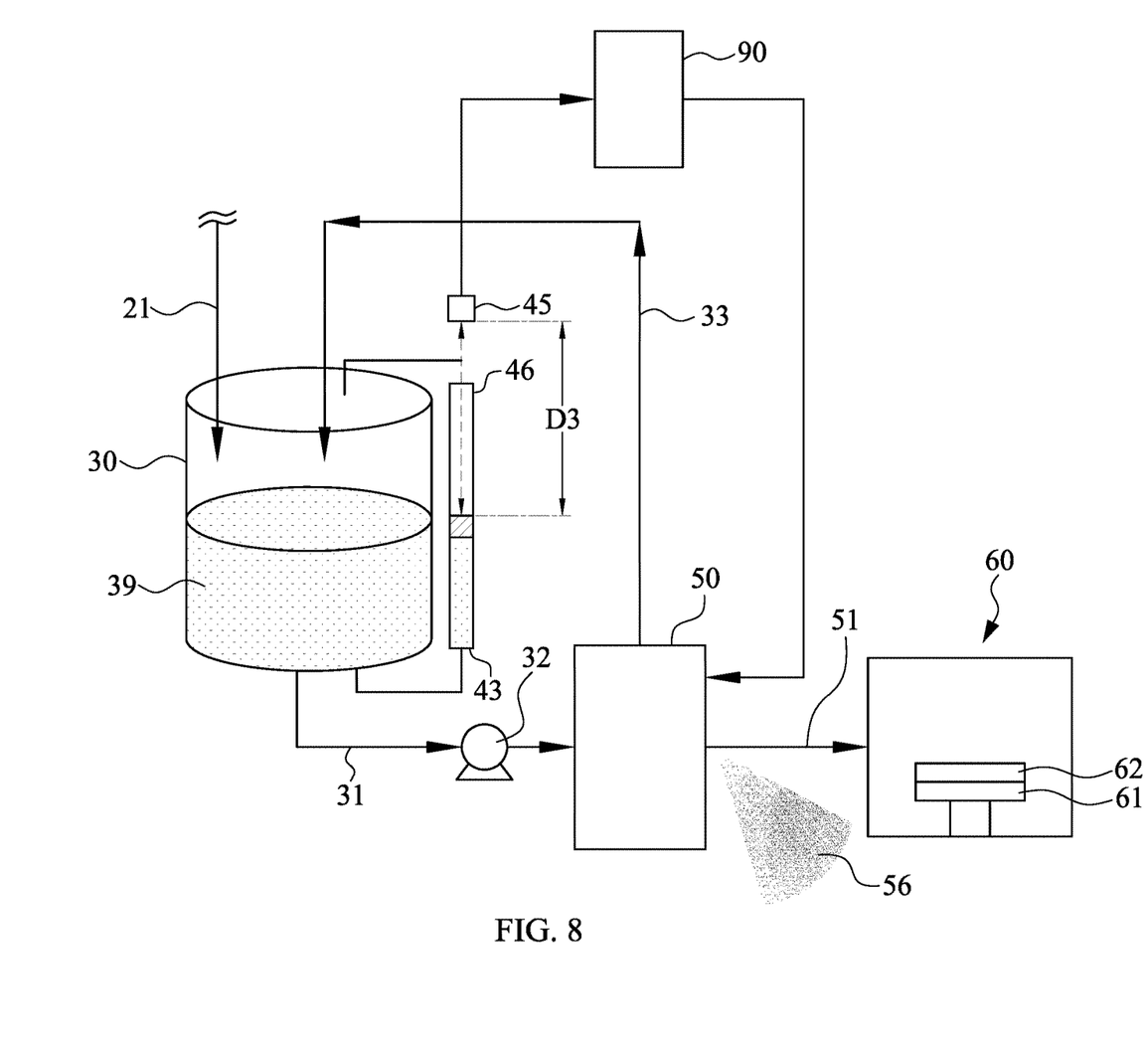
FIG. 8 is a schematic view illustrating an operation of a method for regulating liquid in which a liquid leakage is detected in a discharging piping connecting a processing tool, in accordance with some embodiments of the present disclosure.

In some embodiments, the data in relation to the quantity of the liquid is used to monitor whether an abnormality occurs in the liquid supply system 1. For example, as shown in FIG. 8, while the supply of the liquid 39 from the day tank 30 to the processing tool 60 is performed for a period of time, the level of the liquid 39 in the day tank 30 lowers gradually, which causes an increasing of a distance D3 between the detection member 45 and the floating member 44. In some embodiments, the controller 90 stores an archive data which exhibits a predicted usage of the liquid for performing a preset process in the processing tool 60. During the supply of the liquid 39 from the day tank 30, the controller 90 continuously compares the calculated distance D3 and the archive data. If the difference between the calculated distance D3 and the archive data is out of an acceptable value, the controller 90 issues an alarm to indicate there is an abnormality in the liquid supply system 1. Such abnormalities may indicate that there is a fault with the liquid supply system 1. For example, a leakage 56 of chemical liquid outside of the discharging piping 51 may cause the distance D3 to vary from the expected value. In some embodiments, when the abnormality is identified, the supply of the liquid to the processing tool 60 is terminated to avoid leakage lasting.

Figure 9:
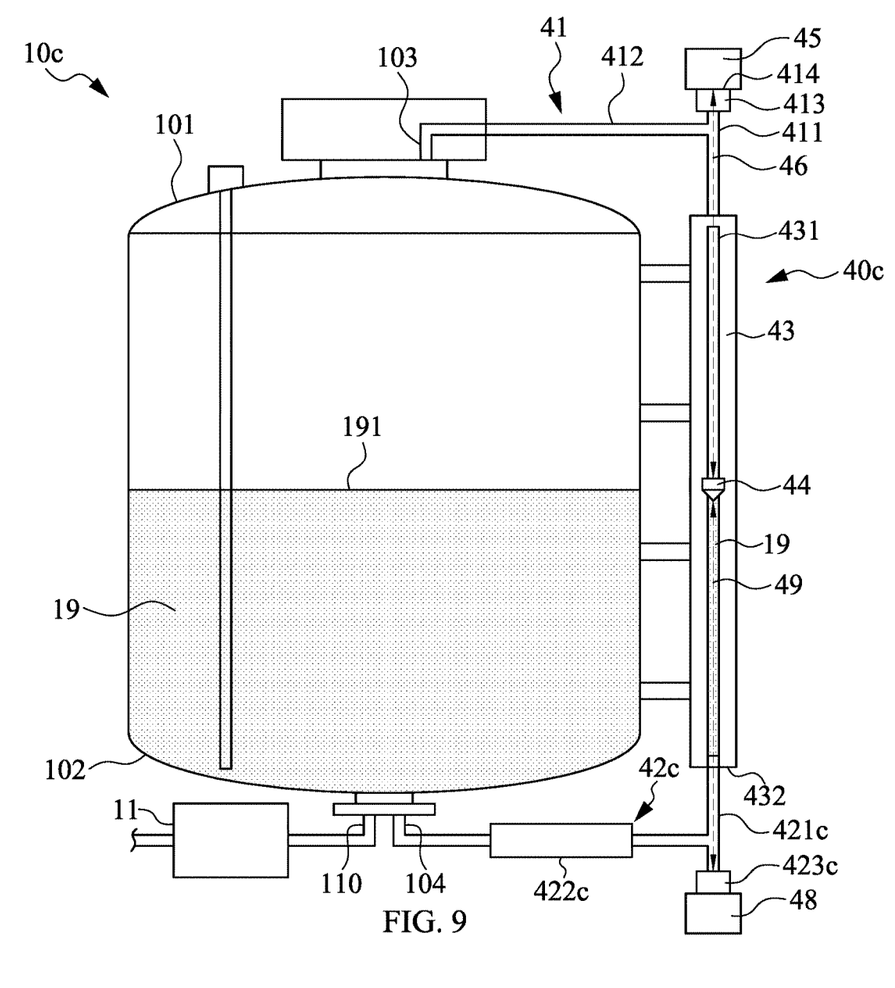
FIG. 9 is a schematic view of a liquid tank with a liquid measurement module, in accordance with some embodiments of the present disclosure.

FIG. 9 is a schematic view of the liquid tank 10C with a liquid measurement module 40c, in accordance with some embodiments of the present disclosure. The components in FIG. 9 that use the same reference numerals as the components of FIG. 2 refer to the same components or equivalent components thereof. For the sake of brevity, it will not be repeated here. Differences between the liquid measurement module 40c and the liquid measurement module 40 include the lower connecting line 42 being replaced with a lower connecting line 42c and the liquid measurement module 40c including another detection member 48.

In some embodiments, the lower connecting line 42c connects a lower end 432 of the tube 43 to the connecting port 104 of the source tank 10. As shown in FIG. 9, the lower connecting line 42c has a right-angle portion and includes a first segment 421c and a second segment 422c. The first segment 421c is connected to the lower end 432 of the tube 43 and extends in a longitudinal direction of the tube 43. The second segment 422c connects the first segment 421c to the connecting port 104 and extends in a horizontal direction. An intersection point of the first segment 421c and the second segment 422c is distant away from an end of the first segment 421c that is away from the tube 43. As a result, the lower connecting line 42c constitutes a T-shaped structure.

In some embodiments, the lower connecting line 42c further includes a cap portion 423c connected to the end of the first segment 421c that is away from the tube 43. The cap portion 423c has a wider width than the first segment 421c. In some embodiments, the first segment 421c, the second segment 422c and the cap portion 423c of the lower connecting line 42c are integrally formed with the same material. In some embodiments, at least the cap portion 423c of the lower connecting line 42c is made material which allows a transmission of a detection signal generated by the detection member 48 passing therethrough. In one exemplary embodiment of the present disclosure, the cap portion 423c of the lower connecting line 42c is constructed of a transparent material such Teflon™ PFA (perfluoroalkoxy alkane) or the like.

In some embodiments, the detection member 48 has the same configuration as that of the detection member 45 and is connected to cap portion 423c of the lower connecting line 42c. In operation, a detection signal 49, such as laser beam, is generated by the detection member 48 and projected toward the floating member 44 in the tube 43. Specifically, as shown in FIG. 9, the detection signal 49 from the detection member 48 enters the lower connecting line 42c by passing through the cap portion 423c and then travels along the first segment 421c of the lower connecting line 42c. The detection signal 49 from the first segment 421c of the lower connecting line 42c is then transmitted into the tube 43 by passing through the lower end 432 of the tube 43, and is projected on the bottom surface 444 (FIG. 3) of the floating member 44. The detection signal 49 reflected by the bottom surface 444 then passes through the first segment 421c and the cap portion 423c and enters the detection member 48.

Figure 10:
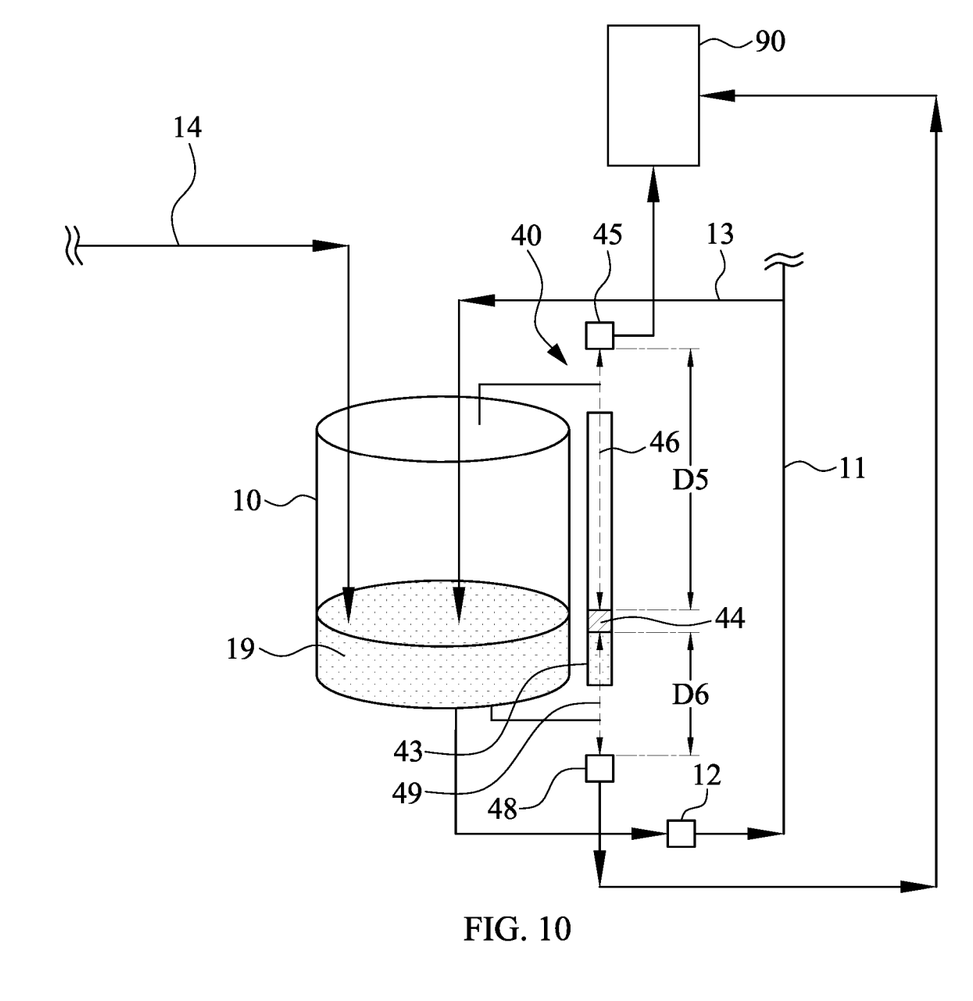
FIG. 10 is a schematic view illustrating an operation of a method for regulating liquid in which a viscosity of a liquid in the liquid tank is monitored by a liquid measurement module, in accordance with some embodiments of the present disclosure.

In some embodiments, the quantity of the fluid in the fluid tank is measured by analyzing the detection signal received by the detection member 48. For example, as shown in FIG. 10, after the detection member 48 receiving the detection signal 49 reflected from the bottom surface of the floating member 44, the detection member 48 calculates a traveling time $\Delta t_2 = t4 - t3$ of the detection signal, wherein t3 is the time when the detection member 48 transmits the detection signal 49 and t4 is the time when the detection member 48 receive the detection signal 49 reflected from the floating member 44. The calculated time interval is then sent to the controller 90, and the controller 90 calculates a distance D6 between the detection member 48 and the floating member 44 following the equation of $D6 = c*\Delta t_2/2$, where c is speed of light. Once the distance D6 between the detection member 48 and the floating member 44 is determined, the quantity of the liquid 19, which is proportional to the distance D6 can be determined. In some embodiments, the distance D5 between the detection member 45 and the floating member 44 is also calculated to determine the quantity of the liquid 19.

In some embodiments, the viscosity of the fluid in the fluid tank is measured by analyzing the detection signal received by the detection member 48. For example, after the detection member 48 receiving the detection signal 49 reflected from the bottom surface of the floating member 44, the detection member 48 calculates a difference between an intensity of the detection signal 49 transmitted by the detection member 48 and an intensity of the detection signal 49 reflected from the bottom surface of the floating member 44.

In some embodiments, the fluid with a higher viscosity exhibits a lower transmission rate relative to the detection signal 49. As a result, the reduction of the intensity of the detection signal 49 is related to the viscosity of fluid stored in the fluid tank. In some embodiments, the controller 90 stores an archive data which represents an intensity of the detection signal 49 when the fluid is in a normal condition, i.e., the fluid is ready for being used in the following process. The archive data may be correlated with the level of the liquid detected by the detection member 45. The controller 90 may continuously compare the data in relation to the intensity of the detection signal 49 and the archive data and issues a trigger signal to the liquid transfer pump 12 to execute a circulation process when the comparison shows abnormity. The circulation process may decrease the viscosity of the fluid and may be terminated when the detected intensity of the detection signal backs to a normal value.

Figure 11:
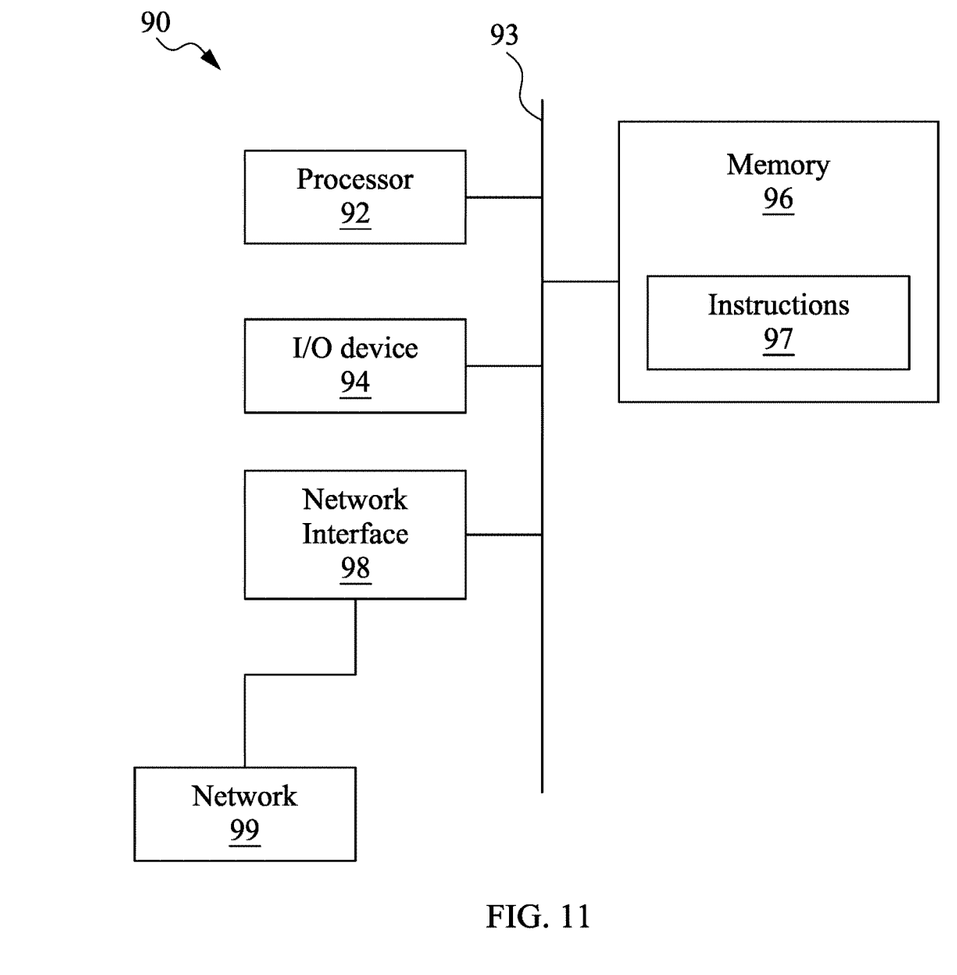
FIG. 11 is a black diagram of a controller, in accordance with some embodiments of the present disclosure.

FIG. 11 is a schematic diagram of a controller 90, in accordance with some embodiments. The controller 90 generates output control signals for controlling operations of the valves, the pumps and the mixer of the liquid supply system 1, in accordance with some embodiments. The controller 90 receives input signals from the liquid measurement modules that connects to the liquid tanks 10, 20 and 30 in accordance with some embodiments.

The controller 90 includes a processor 92, an input/output (I/O) device 94, a memory 96, and a network interface 98 each communicatively coupled via a bus 93 or other interconnection communication mechanism.

The processor 92 is arranged to execute and/or interpret one or more set of instructions 97 stored in the memory 96 to control the liquid supply system 1. In some embodiments, the processor 92 is a central processing unit (CPU), a multi-processor, a distributed processing system, an application specific integrated circuit (ASIC), and/or a suitable processing unit.

The I/O device 94 is coupled to external circuitry. In some embodiments, the I/O device 94 includes a keyboard, keypad, mouse, trackball, trackpad, and/or cursor direction keys for communicating information and commands to the processor 92.

The memory 96 (also referred to as a computer-readable medium) includes a random access memory or other dynamic storage device, communicatively coupled to the bus 93 for storing data and/or instructions for execution by the processor 92. In some embodiments, the memory 96 is used for storing temporary variables or other intermediate information during execution of instructions to be executed by the processor 92 for operating the liquid supply system 1. In some embodiments, the memory 96 also includes a read-only memory or other static storage device coupled to the bus 93 for storing static information and instructions for the processor 92. In some embodiments, the memory 96 is an electronic, magnetic, optical, electromagnetic, infrared, and/or a semiconductor system (or apparatus or device). For example, the memory 96 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 96 includes a compact disk-read only memory (CD-ROM), a compact disk-read/write (CD-R/W), and/or a digital video disc (DVD).

The memory 96 is encoded with, i.e., storing, the computer program code, i.e., a set of executable instructions 97, for controlling one or more components of the valves, the pumps and the mixer and causing the controller 90 to perform the method S80. In some embodiments, the memory 96 also stores information needed for performing the method S80 as well as information generated during performing the method S80.

The network interface 98 includes a mechanism for connecting to a network 99, to which one or more other computer systems are connected. In some embodiments, the network interface 98 includes a wired and/or wireless connection mechanism. The network interface 98 includes wireless network interfaces such as BLUETOOTH, WIFI, WIMAX, GPRS, or WCDMA; or wired network interface such as ETHERNET, USB, or IEEE-1394. In some embodiments, the controller 90 is coupled with one or more components of the liquid supply system 1 via the network interface 98. In some embodiments, the controller 90 is directly coupled with one or more components of liquid supply system 1, e.g., with the components coupled to the bus 93 instead of via the network interface 98.

Embodiments of the disclosure provide a liquid supply system and a method for preparing liquid in the liquid supply system are disclosed. The system includes a liquid measurement module for measuring quantity of the liquid stored in the liquid tank in real time. The liquid measurement module provides a more accurate measurement result than other approaches, such as using ultrasound or capacitive sensors, and thus the measurement result can be utilized for a various applications during the preparation of the liquid in the liquid supply system.

In accordance with some embodiments, a liquid preparation method is provided. The method includes measuring, with a detection member, a quantity of a liquid stored in a liquid tank by emitting a detection signal toward a floating member positioned in a tube. The tube extends in a height direction of the liquid tank and fluidly connects to two connecting ports of the liquid tank that are located at opposite sides of a surface of the liquid, and the position of the floating member in the tube varies according to a level of the liquid in the fluid tank. The method also includes regulating the liquid in the liquid tank in response to the quantity of the liquid in the liquid tank.

In accordance with some embodiments, a liquid preparation method is provided. The method includes supply a liquid from a liquid tank to a processing tool through a discharging piping. The method also includes determine whether an abnormal of the supplying of the liquid occurs by measuring a height of chemical liquid in a tube which is connected to the liquid tank. The measurement of the height of chemical liquid includes emitting, by a signal source, a detection signal toward a floating member which is positioned in a tube that positioned outside of the liquid tank. The measurement of the height of chemical liquid also includes calculating a time interval ($\Delta t$) between a first time point (t1) when the detection signal is generated by the signal source and a second time point (t2) when a signal receiver receives the detection signal reflected from the floating member. When the time interval ($\Delta t$) is greater than a predetermined value, a controller determines the abnormality occurs.

In accordance with some embodiments, a liquid preparation method is provided. The method includes preparing a liquid mixture. The preparation of liquid mixture includes supplying a liquid tank with a first type of liquid. The preparation of liquid mixture also includes measuring, with a detection member, the amount of the first type of liquid filled into the liquid tank by emitting a detection signal toward a floating member positioned in a tube. The tube extends in a height direction of the liquid tank and fluidly connects to two connecting ports of the liquid tank that are located at opposite sides of a surface of the liquid, and the position of the floating member in the tube varies according to a level of the liquid mixture in the fluid tank. The preparation of liquid mixture further includes stopping the supply of the first type of liquid when the amount of the first type of liquid filled into the liquid tank reaches a desired amount. The method also includes supplying the liquid mixture in the liquid tank to a processing tool for processing a semiconductor wafer after the preparation of the liquid mixture.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A liquid preparation method in a liquid supply system, comprising:
    supplying a liquid from a liquid tank to a processing tool in which a wafer is located;
    measuring, with a detection member, a quantity of the liquid stored in the liquid tank by emitting a detection signal toward a floating member positioned in a tube, wherein the tube extends in a height direction of the liquid tank and fluidly connects to two connecting ports of the liquid tank that are located at opposite sides of a surface of the liquid, and the position of the floating member in the tube varies according to a level of the liquid in the liquid tank; and
    regulating the liquid in the liquid tank in response to the quantity of the liquid in the liquid tank,
    wherein the detection signal is transmitted to the tube via an upper connecting line that connects an upper end of the tube to the liquid tank, and the detection signal from the detection member in the upper connecting line travels along a longitudinal direction of the tube.

2. The liquid preparation method of claim 1, wherein the detection signal projecting on the floating member and reflected by the floating member are both transmitted parallel to the longitudinal direction of the tube.

3. The liquid preparation method of claim 1, wherein the detection signal is reflected by a flat surface of the floating member.

4. The liquid preparation method of claim 3, wherein the flat surface is on a top surface of the floating member.

5. The liquid preparation method of claim 3, wherein the flat surface is on a bottom surface of the floating member.

6. The liquid preparation method of claim 1, wherein the detection signal comprises a laser beam.

7. The liquid preparation method of claim 1, wherein the regulating the liquid in the liquid tank comprises refilling the liquid tank with the liquid, mixing at least two liquids in the liquid tank, initiating a circulation process of the liquid, and stopping a delivery of the liquid from the liquid tank.

8. The liquid preparation method of claim 1, wherein the measurement of the quantity of the liquid stored in the liquid tank comprises:
    calculating a time interval ($\Delta t$) between a first time point (t1) when the detection signal is generated by a signal source of the detection member and a second time point (t2) when a signal receiver of the detection member receives the detection signal reflected from the floating member; and
    calculating a distance (D) between the detection member and the floating member according to the equation of $D = c \cdot \Delta t / 2$, where c is speed of light.

9. The liquid preparation method of claim 1, further comprising monitoring whether an abnormality occurs in the liquid supply system based on the measurement of the quantity of the liquid stored in the liquid tank.

10. The liquid preparation method of claim 1, wherein the detection signal transmitted in the tube travels in a direction parallel to the height direction of the liquid tank.

11. A liquid preparation method in a liquid supply system, comprising:
    supplying a liquid from a liquid tank to a processing tool through a discharging piping;
    determining whether an abnormal of the supplying of the liquid occurs by measuring a height of chemical liquid in a tube which is connected to the liquid tank, wherein the measurement of the height of chemical liquid comprises:
        emitting, by a signal source, a detection signal toward a floating member which is positioned in the tube that positioned outside of the liquid tank; and
        calculating a time interval ($\Delta t$) between a first time point (t1) when the detection signal is generated by the signal source and a second time point (t2) when a signal receiver receives the detection signal reflected from the floating member, wherein when the time interval ($\Delta t$) is greater than a predetermined value, a controller determines the abnormality occurs.

12. The liquid preparation method of claim 11, wherein the abnormal of the supplying of the liquid represents a leakage of chemical liquid outside of the discharging piping.

13. The liquid preparation method of claim 11, wherein the measurement of the height of chemical liquid further comprises calculating a distance (D) between the signal source and the floating member according to the equation of D=c*Δt/2, where c is speed of light.

14. The liquid preparation method of claim 11, wherein the signal source is mounted on an upper end of the tube which is made of transparent material, the detection signal generated by the signal source passes through the upper end of the tube and then is transmitted to the floating member.

15. The liquid preparation method of claim 11, wherein the detection signal comprises a laser beam.

16. A liquid preparation method in a liquid supply system, comprising:
preparing a liquid mixture by the following operations:
supplying a liquid tank with a first type of liquid;
measuring, with a detection member, the amount of the first type of liquid filled into the liquid tank by emitting a detection signal toward a floating member positioned in a tube, wherein the tube extends in a height direction of the liquid tank and fluidly connects to two connecting ports of the liquid tank that are located at opposite sides of a surface of the liquid mixture, and the position of the floating member in the tube varies according to a level of the liquid mixture in the liquid tank; and
stopping the supply of the first type of liquid when the amount of the first type of liquid filled into the liquid tank reaches a first desired amount; and
supplying the liquid mixture in the liquid tank to a processing tool for processing a semiconductor wafer after the preparation of the liquid mixture,
wherein the preparation of the liquid mixture further comprises:
supplying the liquid tank with a second type of liquid;
measuring, with the detection member, the amount of the second type of liquid filled into the liquid tank;
stopping the supply of the second type of liquid when the amount of the second type of liquid filled into the liquid tank reaches a second desired amount; and
blending the first type of liquid and the second type of liquid in the liquid tank.

17. The liquid preparation method of claim 16, wherein the detection signal projecting on the floating member and reflected by the floating member are both transmitted parallel to a longitudinal direction of the tube.

18. The liquid preparation method of claim 16, wherein the detection member is mounted on an upper end of the tube which is made of transparent material, the detection signal generated by the detection member passes through the upper end of the tube and then is transmitted to the floating member.

19. The liquid preparation method of claim 16, wherein the detection signal comprises a laser beam.

20. The liquid preparation method of claim 16, wherein the detection signal transmitted in the tube travels in a direction parallel to the height direction of the liquid tank.

* * * * *